(12) United States Patent
Verbaas et al.

(10) Patent No.: US 12,094,753 B2
(45) Date of Patent: Sep. 17, 2024

(54) STAGE DEVICE AND SUBSTRATE PROCESSING APPARATUS

(71) Applicant: Tokyo Electron Limited, Tokyo (JP)

(72) Inventors: Melvin Verbaas, Austin, TX (US);
Einosuke Tsuda, Nirasaki (JP);
Kentaro Asakura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 599 days.

(21) Appl. No.: 17/363,401

(22) Filed: Jun. 30, 2021

(65) Prior Publication Data
US 2022/0013402 A1 Jan. 13, 2022

(30) Foreign Application Priority Data
Jul. 10, 2020 (JP) .................. 2020-119306

(51) Int. Cl.
*H01L 21/687* (2006.01)
*H01J 37/32* (2006.01)
*H05B 3/22* (2006.01)

(52) U.S. Cl.
CPC ......... *H01L 21/68742* (2013.01); *H05B 3/22* (2013.01); *H01J 37/32724* (2013.01); *H01J 2237/20235* (2013.01)

(58) Field of Classification Search
CPC .................. H01L 21/68742; H05B 3/22; H01J 37/32724; H01J 2237/20235
See application file for complete search history.

(56) References Cited

U.S. PATENT DOCUMENTS

| 2001/0019741 A1* | 9/2001 | Inaba ............ C23C 14/564 427/444 |
| 2010/0032096 A1* | 2/2010 | Yu ............... H01L 21/68721 156/345.52 |
| 2014/0054282 A1* | 2/2014 | Wang ............ H01L 21/67103 219/521 |

FOREIGN PATENT DOCUMENTS

| JP | S60-116 U | 1/1985 |
| JP | H02-073619 A | 3/1990 |
| JP | 2009-068037 A | 4/2009 |
| JP | 2015-519730 A | 7/2015 |
| JP | 2016-129183 A | 7/2016 |
| JP | 2017-174820 A | 9/2017 |
| KR | 1020060056653 A | 5/2006 |
| KR | 1020080053587 A | 6/2008 |
| KR | 1020140071611 A | 6/2014 |
| KR | 10-2015-0022485 A | 3/2015 |
| WO | 2011030607 A1 | 3/2011 |

* cited by examiner

*Primary Examiner* — Seahee Hong
(74) *Attorney, Agent, or Firm* — Nath, Goldberg & Meyer; Jerald L. Meyer; Tanya E. Harkins (57) ABSTRACT

A stage device includes: a stage having a pin hole provided therein and a placement surface on which a substrate is placed; and at least one lift pin configured to move up and down through the pin hole; and a lifter configured to raise and lower the at least one lift pin, wherein the stage includes a first heating part provided therein and configured to heat the stage, and the at least one lift pin includes a second heating part provided therein or therearound and configured to heat the at least one lift pin.

8 Claims, 8 Drawing Sheets

STAGE DEVICE AND SUBSTRATE PROCESSING APPARATUS

CROSS-REFERENCE TO RELATED APPLICATION

This application is based upon and claims the benefit of priority from Japanese Patent Application No. 2020-119306, filed on Jul. 10, 2020, the entire contents of which are incorporated herein by reference.

TECHNICAL FIELD

The present disclosure relates to a stage device and a substrate processing apparatus.

BACKGROUND

Patent Document 1 discloses a substrate placement mechanism which includes a heater plate having a first lift pin insertion hole, a temperature control jacket having a second lift pin insertion hole, a first lift pin, and a second lift pin. The heater plate has a target substrate placement surface on which a target substrate is placed, and a heating element is embedded in the first lift pin insertion hole to heat the target substrate to a film formation temperature. The first lift pin insertion hole has a wide-diameter portion at the side of the target substrate placement surface and a narrow-diameter portion located at the side opposite to the target substrate placement surface and having a diameter smaller than that of the wide diameter portion. The temperature control jacket having the second lift pin insertion hole is provided to cover at least a surface other than the target substrate placement surface of the heater plate, and the second lift pin insertion hole has a non-film formation temperature less than the film formation temperature and includes a wide-diameter portion at the side of the target substrate placement surface and a narrow-diameter portion located at the side opposite to the target substrate placement surface and having a diameter smaller than that of the wide-diameter portion. The first lift pin is inserted through the first lift pin insertion hole, and includes a cover portion that can be inserted into the wide-diameter portion of the first lift pin insertion hole, and a shaft portion that is connected to the cover portion and can be inserted into both the wide-diameter portion and the narrow-diameter portion of the first lift pin insertion hole. The second lift pin is inserted through the second pin insertion hole, and includes a cover portion that can be inserted into the wide-diameter portion of the second lift pin insertion hole, and a shaft portion that is connected to the cover portion and can be inserted into both the wide-diameter portion and the narrow-diameter portion of the second lift pin insertion hole.

PRIOR ART DOCUMENT

Patent Document

Patent Document 1: Japanese Laid-Open Patent Publication No. 2009-068037

SUMMARY

A stage device according to an embodiment of the present disclosure includes: a stage having a pin hole provided therein and a placement surface on which a substrate is placed; and at least one lift pin configured to move up and down through the pin hole; and a lifter configured to raise and lower the at least one lift pin, wherein the stage includes a first heating part provided therein and configured to heat the stage, and the at least one lift pin includes a second heating part provided therein or therearound and configured to heat the at least one lift pin.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, a stage device and a substrate processing apparatuses according to embodiments of the present disclosure will be described with reference to the drawings. In the specification and drawings, constituent elements that are substantially the same will be denoted by the same reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus According to Embodiment and Stage Device According to First Embodiment]

Figure 1:
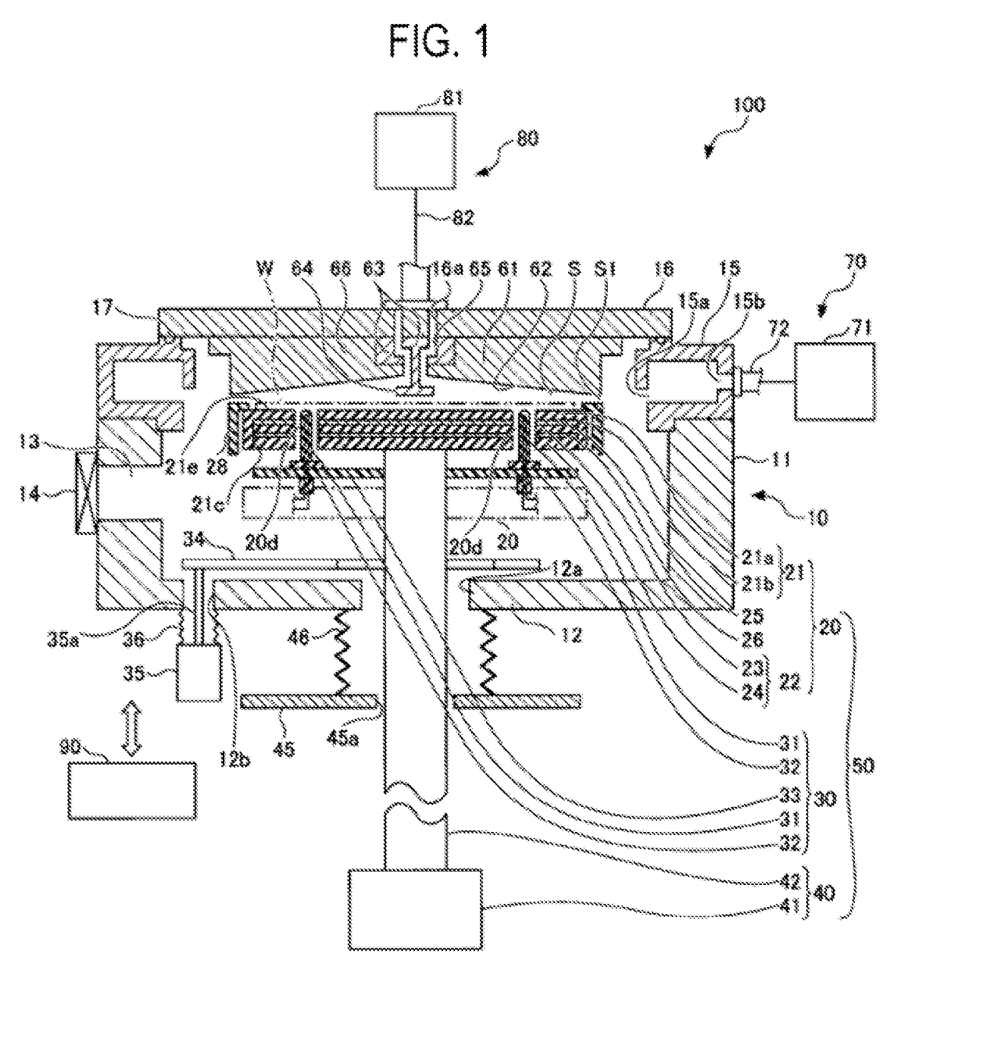
FIG. 1 is a vertical cross-sectional view illustrating an example of a substrate processing apparatus according to an embodiment.
Figure 2:
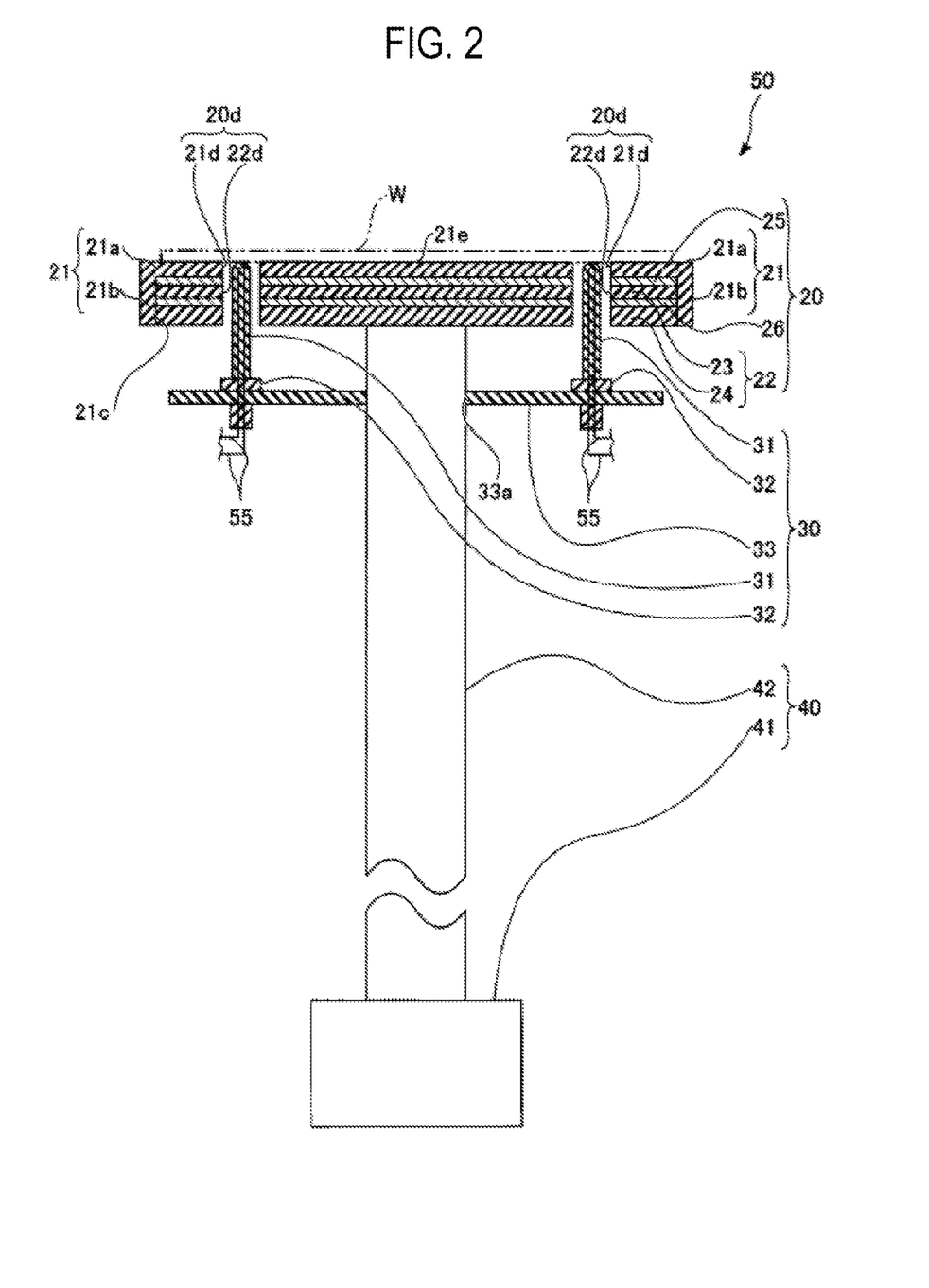
FIG. 2 is a vertical cross-sectional view illustrating an example of a stage device according to a first embodiment.
Figure 3:
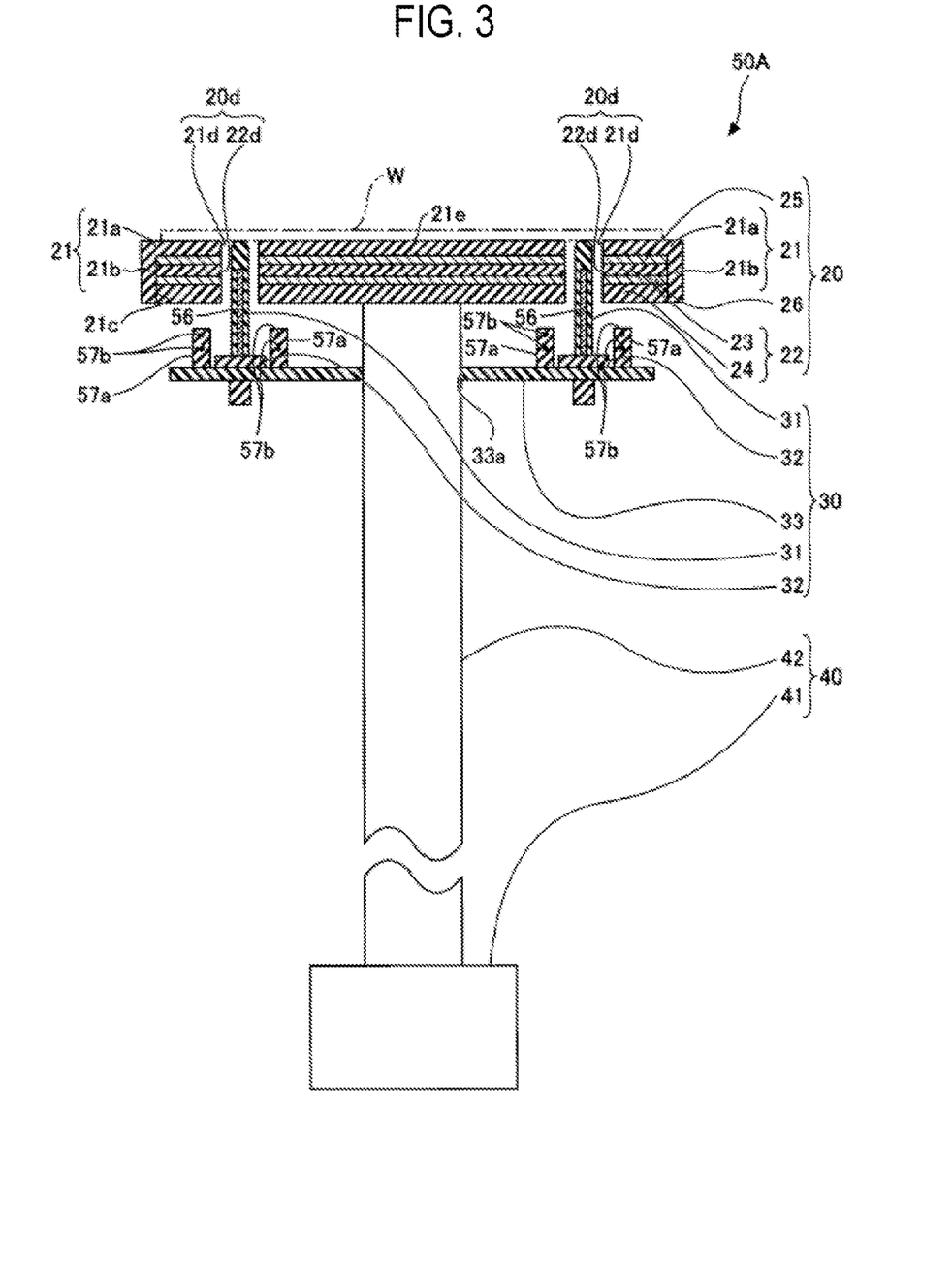
FIG. 3 is a vertical cross-sectional view illustrating another example of the stage device according to the first embodiment.
Figure 4:
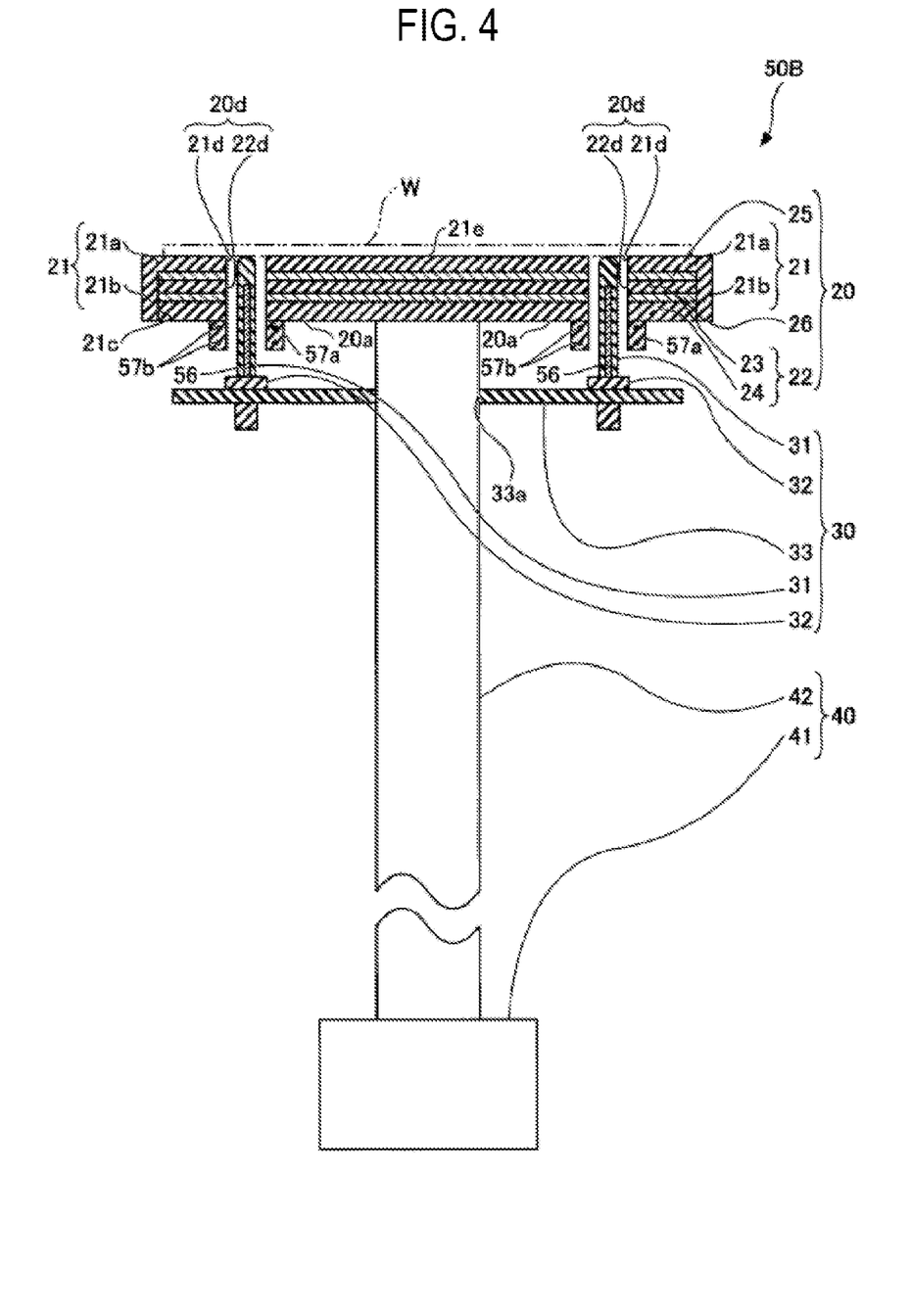
FIG. 4 is a vertical cross-sectional view illustrating still another example of stage device according to the first embodiment.

First, an example of a substrate processing apparatus according to an embodiment of the present disclosure and an example of a stage device according to a first embodiment will be described with reference to FIGS. 1 to 4. FIG. 1 is a vertical cross-sectional view illustrating an example of a substrate processing apparatus according to an embodiment. FIG. 2 is a vertical cross-sectional view illustrating an example of a stage device according to a first embodiment constituting the substrate processing apparatus, and FIGS. 3 and 4 are vertical cross-sectional views illustrating another examples of the stage device according to the first embodiment, respectively.

A substrate processing apparatus 100 illustrated in FIG. 1 is an apparatus capable of performing film formation, sputtering, and etching, such as a chemical vapor deposition (CVD) apparatus and an atomic layer deposition (ALD) apparatus. The substrate processing apparatus 100 includes a processing container 10, which is a chamber, and a stage device 50 disposed inside the processing container 10 and configured to move a substrate W placed thereon up and down. Hereinafter, the substrate W will be referred to as a "wafer W", which is a semiconductor wafer as an example of the substrate W. The substrate processing apparatus 100 includes a supply device 80 configured to supply a processing gas or a purge gas to the processing container 10, an exhaust device 70 configured to exhaust various processing gases or purge gases from the inside of the processing container 10 and to evacuate the inside of the processing container 10 to reduce an internal pressure of the processing container 10, and a controller 90 configured to control each device.

The stage device 50 includes a stage 20 configured to place the substrate W thereon and having pin holes 20d formed therein, a lift pin unit 30 having lift pins 31 and configured to vertically pass through the respective pin holes 20d, and a lifting unit 40 configured to vertically move and rotate the lift pin unit 30. By driving a lifter 41 that constitutes the lifting unit 40, the stage 20 is capable of moving up and down between a transfer position indicated by a two-dot chain line and a processing position above the transfer position. Here, the transfer position is a position where the stage 20 waits when the wafer W is delivered between a transfer device (not illustrated) for the wafer W, which enters the processing container 10 through a loading/unloading port 13 of the processing container 10, and the lift pins 31. In addition, the processing position is a position where a process such as film formation is performed on the wafer W. The stage device 50 will be described in detail below. The substrate processing apparatus 100 may include other stage devices 50A to 50C to be described in detail below.

The processing container 10 is made of a metal such as aluminum, and has a side wall 11 having a substantially cylindrical shape and a bottom plate 12 having a circular shape in a plan view. The loading/unloading port 13 through which the wafer W is loaded or unloaded is provided in the side wall 11. The loading/unloading port 13 can be opened and closed by a gate valve 14. An annular exhaust duct 15 having a substantially rectangular cross section is disposed above the processing container 10. The exhaust duct 15 has a slit 15a formed along the inner peripheral surface thereof. In addition, an exhaust port 15b is formed in the outer wall of the exhaust duct 15. On the upper surface of the exhaust duct 15, a ceiling plate 16 is provided so as to close an upper opening of the processing container 10. A seal ring 17 is disposed at a contact interface between the ceiling plate 16 and the exhaust duct 15. The ceiling plate 16 and the exhaust duct 15 are air-tightly sealed by the seal ring 17.

A cap member 61 is attached to a bottom surface of the ceiling plate 16. A processing space S in which the substrate W is processed is formed between the cap member 61 and the stage 20 which face each other. For example, the cap member 61 is attached to the ceiling plate 16 with bolts or the like.

A mortar-shaped recess 62 is provided on the bottom surface of the cap member 61. The height of the stage 20 when the processing space S is formed is set such that a gap Si is formed between the lowermost end of the recess 62 in the cap member 61 and the upper end of the shield member 28 arranged around the stage 20. The recess 62 may be preferably formed such that the volume of the processing space S is as small as possible and a gas replacement rate of the processing gas by purging is improved.

A gas introduction path 65 is formed in the center of the cap member 61 to introduce the processing gas or the purge gas into the processing space S. The gas introduction path 65 penetrates the central portion of the cap member 61, and is provided such that the lower end thereof faces the center of the wafer W on the stage 20. A flow path forming member 63 is fitted into the center of the cap member 61. The upper side of the gas introduction path 65 is branched by the flow path forming member 63 so that each of the branched paths of the gas introduction path communicates with a gas introduction path 16a that penetrates the ceiling plate 16.

The supply device 80 includes a plurality of gas sources 81 configured to individually supply a plurality of processing gases and a purge gas to be applied to a plurality of processes, wherein the supply of the gases are continuously performed inside the processing container 10, and a plurality of gas supply pipes 82 configured to supply various types of processing gases and the purge gas from the plurality of gas sources 81 therethrough. The gas supply pipes 82 communicate with the gas introduction path 16a. In FIG. 1, one gas source 81 and one gas supply pipe 82 are illustrated for the sake of convenience in illustration. Each gas supply pipe 82 is provided with an opening/closing valve and a flow controller, such as a mass flow controller (all not illustrated). Switching of gas species or control of a flow rate is performed by the opening/closing valve and the mass flow controller.

Below the lower end of the gas introduction path 65 of the cap member 61, a branch plate 64 is provided so as to disperse the gas discharged from the gas introduction path 65 in the processing space S. The branch plate 64 is fixed to the cap member 61 via a support rod 66.

The exhaust device 70 exhausts the inside of the processing container 10 to form a desired depressurized atmosphere. The exhaust device 70 includes an exhaust pipe 72 connected to the exhaust port 15b of the exhaust duct 15 and an exhaust mechanism 71 connected to the exhaust pipe 72. The exhaust mechanism 71 includes a turbo molecular pump or a dry pump, a pressure control valve, an opening/closing valve, and the like (all not illustrated). During an exhaust process, the gas in the processing container 10 reaches the exhaust duct 15 through the slit 15a, and is exhausted from the exhaust duct 15 through the exhaust pipe 72 by the exhaust mechanism 71 of the exhaust device 70. During a process of setting the inside of the processing container 10 at a high pressure, for example, exhaust is performed only by the dry pump. Meanwhile, during a process of setting the inside of the processing container 10 at a low pressure, both the dry pump and the turbo molecular pump are used to perform exhaust. A pressure sensor (not illustrated) is provided inside the processing container 10. The internal pressure of the processing container 10 is controlled by controlling an opening degree of the pressure control valve based on a detection value obtained by the pressure sensor.

The stage 20 constituting the stage device 50 has a first plate 21 and a second plate 22. On the side surface of the disk-shaped stage 20, an annular shield member 28 is provided so as to cover the outer peripheral region of a placement surface 21e and the side surface of the first plate 21 with a slight gap from the first plate 21. The shield member 28 is made of ceramic such as alumina or quartz.

Both the first plate 21 and the second plate 22 are formed of a ceramic material such as aluminum nitride (AlN) or the like, or a metallic material such as aluminum, nickel alloy or the like. When the first plate 21 and the second plate 22 are formed of a ceramic material, the first plate 21 and the second plate 22 are integrated with each other by sintering.

As illustrated in an enlarged view in FIG. 2, the first plate 21 has a box-like cylindrical shape which is composed of a ceiling plate 21a having a circular shape in a plan view and a cylindrical side wall 21b conforming to a contour of the ceiling plate 21a. The first plate 21 includes a non-penetrating recess 21c formed therein. When the first plate 21 is formed of a ceramic material, the ceiling plate 21a and the cylindrical side wall 21b are integrated with each other by sintering. The first plate 21 functions as, for example, an electrostatic chuck.

The second plate 22 is a laminated body in which two third plates 23 and 24 each having the same or substantially the same outer diameter as the inner diameter of the side wall 21b of the first plate 21 are stacked one above the other.

An electrode 25 having an electrostatic attraction function is disposed between the first plate 21 and the second plate 22. The electrode 25 is attached to at least one of the first plate 21 and the second plate 22 through brazing. Here, silver or copper, zinc, aluminum, titanium, nickel, alloys thereof, or the like may be applied as a braze material at the time of brazing. Although not illustrated, the electrode 25 is connected to a direct current (DC) power supply via a feeder line. A switch is provided in the feeder line. When this switch is turned on, a DC voltage is applied from the DC power supply to the electrode 25. As a result, a Coulomb force or a Johnson-Lahbek force is generated. Then, by virtue of the Coulomb force and Johnson-Lahbek force, the wafer W is electrostatically attracted to the placement surface 21e of the first plate 21 as an electrostatic chuck.

In some embodiments, the second plate 22 may be formed by a single second plate instead of the two third plates 23 and 24, or may be a stacked body of three or more third plates. In addition to the configuration in which the electrode 25 is disposed between the first plate 21 and the second plate 22, a configuration in which a heating part such as a heater may be arranged between the first plate 21 and the second plate 22, may be employed.

A temperature sensor, such as a thermocouple (not illustrated), is disposed on the placement surface 21e to monitor temperatures of the placement surface 21e and the wafer W at any time. Monitor information thus obtained is transmitted to the controller 90 at any time. The controller 90 controls the temperatures of the placement surface 21e and the wafer W based on the monitor information. More specifically, set temperature data of the placement surface 21e (and the wafer W) corresponding to various processes are stored in the controller 90. A temperature of a first heating part 26 is adjusted such that the temperature of the placement surface 21e is adjusted to the set temperature.

Meanwhile, the first heating part 26 such as a heater is disposed between the two third plates 23 and 24 constituting the second plate 22. The first heating part 26 is attached to at least one of the two third plates 23 and 24 by brazing. Here, the first heating part 26 may be formed of tungsten or molybdenum, nickel, chromium, titanium, lead, silver, platinum, palladium, or an alloy thereof. In addition, a coolant flow path (not illustrated) through which a coolant supplied from a chiller or the like flows may be built in the third plates 23 and 24.

In the state in which the second plate 22 is accommodated in the non-penetrating recess 21c of the first plate 21, through-holes 21d and 22d through which the respective lift pins 31 move up and down are provided at respective positions of the first plate 21 and the second plate 22, respectively. In addition, pin holes 20d are formed to penetrate the stage 20 while being in communication with the through-holes 21d and 22d. For example, in the illustrated example, two pin holes 20d are formed in the stage 20, and the lift pins 31 move up and down through the respective pin holes 20d. However, the number of pin holes 20d or lift pins 31 is not limited to the illustrated example.

The lift pin unit 30 constituting the stage device 50 includes a plurality of (two in the illustrated example) elongated lift pins 31 and a support member 33 configured to support the lift pins 31. A flange portion 32 is provided at the intermediate position of each lift pin 31. A portion of the lift pin 31 above the flange portion 32 is inserted into the respective pin hole 20d of the stage 20. As illustrated in FIG. 2, a portion of the lift pin 31 below the flange portion 32 is slidably vertically inserted into a respective insertion hole (not illustrated) of the support member 33. The portion of the lift pin 31 below the flange portion 32 has a larger diameter than the upper portion thereof so as to stably support the upper portion protruding upwards from the support member 33.

The lift pins 31, the flange portions 32, and the support member 33 are all made of ceramic such as alumina. For example, in the support member 33 having a circular shape in a plan view, three or four lift pins 31 may be arranged at regular intervals in the circumferential direction such that they are vertically supported by the support member 33 in a slidable manner In such a configuration, three or four pin holes 20d are provided at the respective positions of the stage 20.

As illustrated in FIG. 2, each of the pin holes 20d formed in the stage 20 has an inner diameter larger than that of the lift pin 31 and smaller than that of the flange portion 32.

The lifter unit 40 constituting the stage device 50 includes a lifter 41 and a support member 42 configured to move up and down and rotate by the lifter 41. The support member 42 is fitted into a through-hole 33a of the support member 33 constituting the lift pin unit 30. An upper end of the support member 42 is fixed to the bottom surface of the stage 20 (the third plate 24). The lifter 41 is configured by, for example, a motor, an air cylinder, a combination mechanism thereof, or the like.

As illustrated in FIG. 1, an opening 12a is formed in the center of the bottom plate 12 of the processing container 10. The support member 42 is inserted into the opening 12a.

Here, the length of each lift pin 31 and the position of each flange portion 32 are set so as to satisfy two conditions below in the state in which the lift pin unit 30 is in the processing position. One of the conditions is a condition in which the upper end of each lift pin 31 does not protrude upwards from the placement surface 21e of the stage 20. In FIGS. 1 and 2, the upper end of each lift pin 31 substantially coincides with the placement surface 21e.

The other condition is a condition in which the upper end of each lift pin 31 is located above the bottom surface of the stage 20 (the third plate 24), and at least a portion of each lift pin 31 is partially inserted into the respective pin hole 20d of the stage 20.

As illustrated in FIG. 1, a flange 45 is disposed between the lower side of the bottom plate 12 of the processing container 10 and the lifter 41. The flange 45 has a through-hole 45a formed therein and into which the support member 42 is inserted A bellows 46 connecting the flange 45 and the bottom plate 12 is provided around the support member 42 between the flange 45 and the bottom plate 12.

In addition, the bottom plate 12 includes an additional opening 12b provided at the side of the opening 12a. Further, the bottom plate 12 is provided with a pushing member 34 configured to push the lower ends of the lift pins 31 upwards when the stage 20 is in the transfer position indicated by the two-dot chain line in FIG. 1, a lifter 35 configured to be driven when pushing out the pushing member 34, and a connecting member 35a configured to connect the lifter 35 and the pushing member 34. The pushing member 34 is disposed above the bottom plate 12, the lifter 35 is disposed below the bottom plate 12, and the connecting member 35a is inserted through the opening 12b. In addition, a bellows 36 connecting the bottom plate 12 and the lifter 35 is provided around the connecting member 35a between the bottom plate 12 and the lifter 35.

When the stage 20 is in the transfer position, the lift pins 31 are located inside the pin holes 20d in the state in which the lifter 35 is not driven. Meanwhile, when the wafer W is transferred to a position above the placement surface 21e of the stage 20 by a transfer device (not illustrated), the lifter 35 is driven to push the pushing member 34 upwards. Then, the lift pins 31 are pushed upwards by the pushing member 34 pushed upwards so that the upper ends of the lift pins 31 protrude from the placement surface 21e, and the wafer W is delivered to the lift pins 31. Subsequently, the lifter 35 is driven to lower the pushing member 34 so that the lift pins 31 are accommodated in the respective pin holes 20d and the wafer W is placed on the placement surface 21e.

The first heating part 26 is heated to heat the stage 20. The inside of the processing container 10 is brought to a desired depressurized atmosphere by the exhaust device 70. The processing gas or the like is supplied to the processing space S from the supply device 80. As a result, a film forming process or the like is performed on the surface of the wafer W. At this time, the stage 20 (the placement surface 21e thereof) is heated to, for example, a temperature in a range of about 300 degrees to 800 degrees C. When the stage 20 is heated, a so-called cold spot in which the temperature around the pin holes 20d is lower than that of other regions of the stage 20 may be formed because the stage 20 is provided with the pin holes 20d through which the respective lift pins 31 move up and down. When the cold spot having a temperature relatively lower than that of the other regions is formed on the placement surface 21e, an in-plane distribution in the temperature of the placement surface 21e occurs, which makes it possible to achieve the in-plane uniformity of the temperature of the wafer W placed on the placement surface 21e.

Therefore, in the stage device 50, second heating parts 55 are provided inside the respective lift pins 31 to heat the lift pins 31. Here, each of the second heating parts 55 is formed by, for example, a heater made of an electric resistance element. Although not illustrated, the second heating parts 55 are connected to a DC power supply via feeder lines, and switches are provided in respective feeder lines. When these switches are turned on, a DC voltage is applied from the DC power supply to the second heating parts 55 so that the lift pins 31 are heated by the second heating parts 55. Similarly to the first heating part 26, the second heating parts 55 may also be formed of, for example, tungsten or molybdenum, nickel, chromium, titanium, lead, silver, platinum, palladium, an alloy thereof, or the like.

Since each of the second heating parts 55 is formed of an electric resistance element, the second heating parts 55 may also function as temperature sensors and may monitor the temperatures around the pin holes 20d in the placement surface 21e. Information obtained by the monitoring of the second heating parts 55 is transmitted to the controller 90 at any time, in addition to the information obtained by the monitoring of the additional temperature sensor provided on the placement surface 21e. The controller 90 controls the temperatures of the first heating part 26 and the second heating part 55 such that the temperature of the entire area of the placement surface 21e including the temperatures around the pin holes 20d become a set temperature.

Meanwhile, in a stage device 50A illustrated in FIG. 3, second heating parts 56 formed of a conductor are built in respective lift pins 31, and cylindrical members 57a in which metal-made coils 57b are respectively embedded are disposed around the respective lift pins 31. Here, an example of the material of the conductor may include carbon, graphite or the like. In addition, the cylindrical member 57a is made of, for example, ceramic such as alumina or the like.

Although not illustrated, the coils 57b are connected to a high-frequency power supply via feeder lines. By causing a high-frequency current to flow through the coils 57b, an induced current (or an eddy current) is induced in each of the second heating parts 56, which are conductors, by electromagnetic induction. Then, the lift pins 31 are heated by the second heating parts 56 heated by the induced current. That is, the configuration illustrated in FIG. 3 heats the lift pins 31 by induction heating.

In general, the conductor is a rod-shaped member having a relatively large thickness compared with an ultra-fine electric resistance element. Thus, the conductor is easy to be embed in each lift pin 31, which enhances the productivity of the lift pins 31.

Meanwhile, in a stage device 50B illustrated in FIG. 4, second heating parts 56 formed of conductors are built in the respective lift pins 31 as in the stage device 50A. However, in the stage device 50B, the cylindrical members 57a in which the coils 57b are embedded are fixed to the bottom surface 20a of the stage 20 by brazing or screwing.

In some embodiments, although not illustrated, in instead of the configuration in which the second heating parts 56 made of conductors are built in the respective lift pins 31, a configuration in which all the lift pins 31 may be formed of conductors so that they function as the second heating parts, may be employed. That is, the configuration in which all the lift pins 31 function as the second heating parts may also include a configuration in which the second heating parts are provided inside the respective lift pins 31.

The controller 90 controls the operations of respective components of the substrate processing apparatus 100, such as the first heating part 26 built in the stage 20, the second heating parts 55 and 56 built in the lift pins 31, the supply device 80, the exhaust device 70 and the like. The controller 90 includes a central processing unit (CPU), a read only memory (ROM), and a random access memory (RAM). The CPU executes a predetermined process according to a recipe (a process recipe) stored in a storage area such as the RAM or the like. Control information of the substrate processing apparatus 100 for process conditions is set in the recipe. The control information includes, for example, the flow rate of each gas, the internal pressure of the processing container 10, the internal temperature of the processing container 10, the temperature of the placement surface 21e of the first plate 21 used as an electrostatic chuck, the process time, and the like.

The recipe and the program applied by the controller 90 may be stored in, for example, a hard disk, a compact disk, a magneto-optical disk, or the like. In addition, the recipe or the like may be set by the controller 90 in the state of being stored in a storage medium that can be read by a portable computer, such as a CD-ROM, a DVD, a memory card or the like, and may be read out from the storage medium. In addition, the controller 90 further includes interfaces, such as an input device such as a keyboard, a mouse or the like for inputting commands, a display device such as a display that visually displays the operating status of the substrate processing apparatus 100, and an output device such as a printer.

In the substrate processing apparatus 100, the second heating parts 55 or 56 are built in the respective lift pins 31 to adjust the temperature of the lift pins themselves and the temperature of the stage 20 around the pin holes 20d. Therefore, it is possible to heat the entire placement surface 21e with in-plane uniformity without causing the cold spot. In addition, since the second heating parts 55 or 56 are built in respective lift pins 31, production efficiency is high, which makes it possible to suppress an increase in the cost of producing the apparatus. In addition, since the second heating parts 55 also serve as temperature sensors, the effect of suppressing an increase in the cost of producing the apparatus is further enhanced.

[Stage Device According to Second Embodiment]

Figure 5:
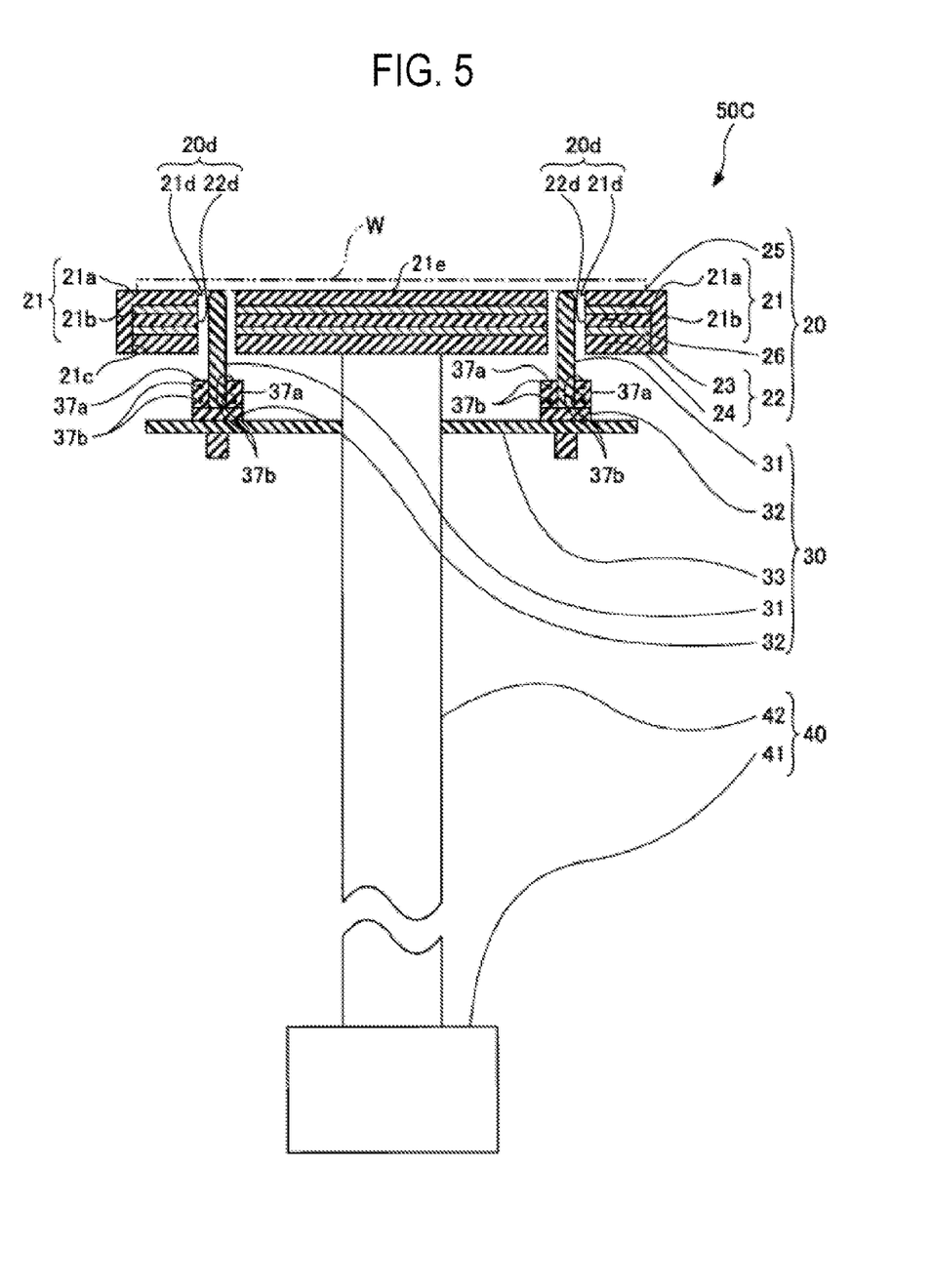
FIG. 5 is a vertical cross-sectional view illustrating an example of a stage device according to a second embodiment.
Figure 6:
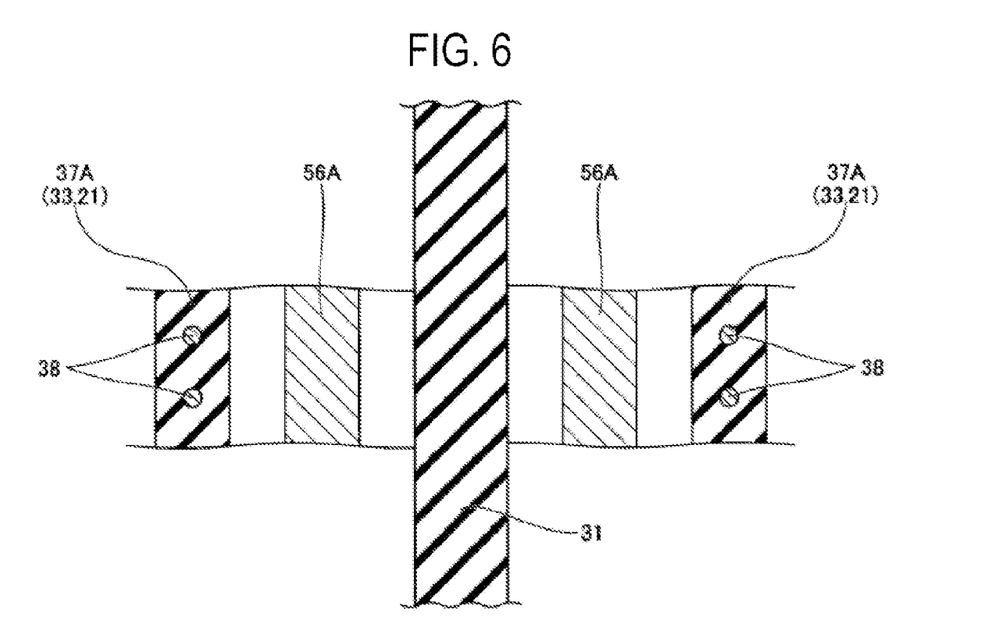
FIG. 6 is a schematic view illustrating a relative relationship between a lift pin, a conductor, and a coil in another example of the stage device according to the second embodiment.

An example of a stage device according to a second embodiment will be described with reference to FIGS. 5 and 6. FIG. 5 is a vertical cross-sectional view illustrating the example of the stage device according to the second embodiment, which constitutes the substrate processing apparatus, and FIG. 6 is a schematic view illustrating a relative relationship between a lift pin, a conductor, and a coil in another example of the stage device according to the second embodiment.

A stage device 50C shown in the figure has a configuration in which second heating parts 37b formed by electric resistance elements are attached around respective lift pins 31.

In the illustrated example, a cylindrical member 37a surrounding each lift pin 31 is provided above the flange portion 32, and the second heating part 37b, such as a heater, is built in the respective cylindrical member 37a. Here, the cylindrical member 37a is made of ceramic such as alumina.

In the stage device 50C, the second heating part 37b attached around each lift pin 31 heats each lift pin 31, and the heated lift pin 31 heats the pin hole 20d around the lift pin 31. As a result, it is possible to heat the entire area of the placement surface 21e with in-plane uniformity without causing the cold spot. In addition, since the second heating part 37b is built in the cylindrical member 37a, which is separated from the lift pin 31, it is possible to further enhance production efficiency and to suppress an increase in the cost of producing the apparatus.

In some embodiments, as illustrated in FIG. 6, a second heating part 56A made of, for example, a cylindrical conductor, may be disposed around each lift pin 31, and a coil 38 may be disposed around the second heating part 56A. In the configuration of the illustrated example, both the second heating part 56A made of a cylindrical conductor and a cylindrical member 37A in which the coil 38 is built, are fixed to the upper surface of the support member 33.

[Stage Device According to Third Embodiment]

Figure 7:
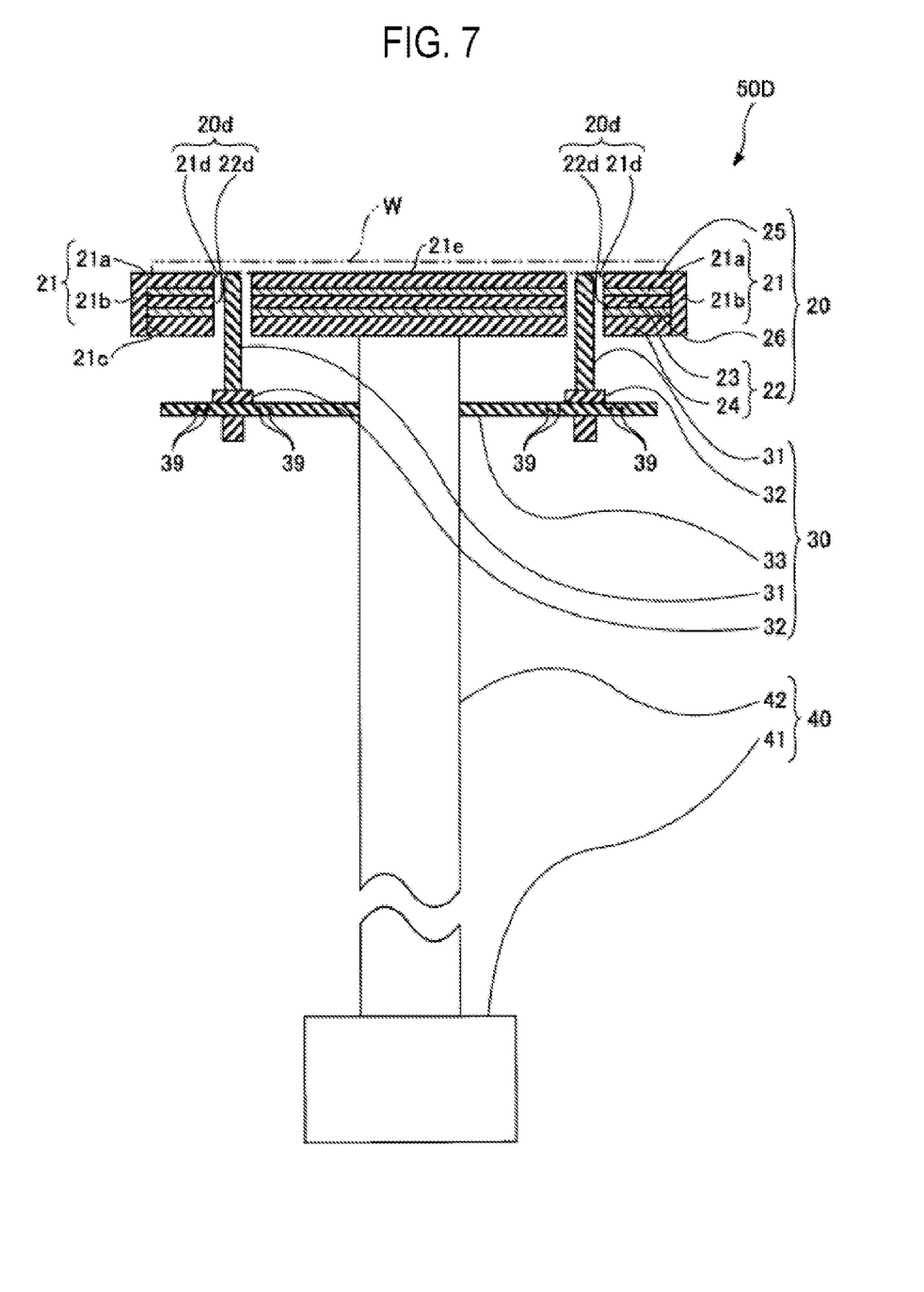
FIG. 7 is a vertical cross-sectional view illustrating an example of a stage device according to a third embodiment.

Next, an example of a stage device according to a third embodiment will be described with reference to FIG. 7. FIG. 7 is a vertical cross-sectional view illustrating the example of the stage device according to the third embodiment, which constitutes the substrate processing apparatus.

A stage device 50D illustrated in the figure has a configuration in which second heating parts 39 formed of electric resistance elements are disposed around respective lift pins 31 in the support member 33 which constitutes the lift pin unit 30 together with the lift pins 31.

In the stage device 50D, each second heating part 39 disposed around each lift pin 31 in the support member 33 heats the lift pin 31 through the support member 33, and the heated lift pin 31 heats the pin hole 20d provided therearound. As a result, it is possible to heat the entire area of the placement surface 21e with in-plane uniformity without causing the cold spot, while suppressing an increase in the cost of producing the apparatus.

As described above, each of the second heating parts 39 of the illustrated example is formed by an electric resistance element. As illustrated in FIG. 6, inside the support member 33, for example, the second heating part 56A made of a cylindrical conductor is disposed near each lift pin 31, and the coil 38 is disposed around the second heating part 56A.

[Stage Device According to Fourth Embodiment]

Figure 8:
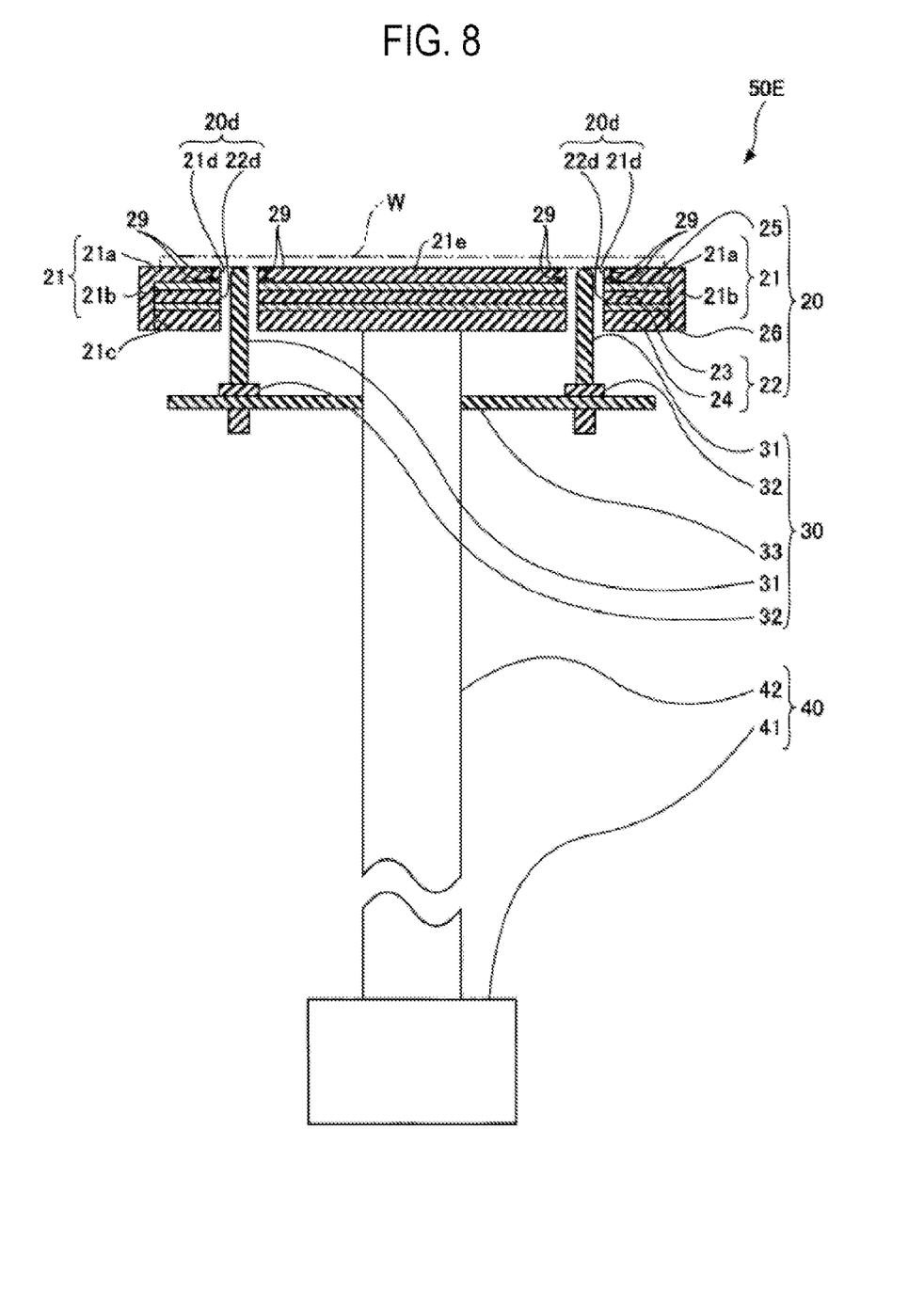
FIG. 8 is a vertical cross-sectional view illustrating an example of a stage device according to a fourth embodiment.

Next, an example of a stage device according to a fourth embodiment will be described with reference to FIG. 8. FIG. 8 is a vertical cross-sectional view illustrating the example of the stage device according to the fourth embodiment, which constitutes the substrate processing apparatus.

A stage device 50E illustrated in the figure has a configuration in which a second heating part 29 formed by an electric resistance element is disposed around each pin hole 20d in the first plate 21 constituting the stage 20.

In the stage device 50E, the second heating part 29 disposed around the pin hole 20d in the first plate 21 directly heats the circumference of the pin hole 20d and heats the lift pin 31 by the resultant radiant heat. As a result, it is possible to heat the entire area of the placement surface 21e with in-plane uniformity without causing the cold spot, while suppressing an increase in the cost of producing the apparatus.

As described above, each of the second heating parts 29 of the illustrated example is formed by an electric resistance element. As illustrated in FIG. 6, inside the first plate 21, for example, the second heating part 56A made of a cylindrical conductor is disposed near each lift pin 31, and the coil 38 is disposed around the second heating part 56A.

In some embodiments, although not illustrated, for example, the cylindrical member illustrated in FIG. 4 may be fixed around the respective pin hole 20d on the bottom surface of the stage 20 by brazing or screwing, and the second heating part formed of an electric resistance element may be built in the cylindrical member.

In some embodiments, other components may be combined with the configurations and the like exemplified in the embodiments described above. Further, the present disclosure is not limited to the configurations illustrated herein. With respect to this point, it is possible to make a change within a scope without deviating from the gist of the present disclosure and to appropriately determine the scope according to an application form thereof. For example, the substrate processing apparatus 100 may be a plasma processing apparatus. Specifically, inductive coupled plasma (ICP) and Electron Cyclotron resonance Plasma (ECP) may be exemplified. In addition, helicon wave plasma (HWP), capacitively coupled plasma (CCP), and the like may be exemplified.

According to the present disclosure, in a stage having a placement surface on which a substrate is placed, it is possible to prevent the areas around the pin holes through which lift pins move up and down and the lift pins from becoming cold spots, which suppresses an in-plane temperature of the placement surface from becoming non-uniform.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage device comprising:
   a stage having a plurality of pin holes provided therein and a placement surface on which a substrate is placed; and
   a plurality of lift pins configured to move up and down through the plurality of pin holes, respectively; and
   a lifter configured to raise and lower the plurality of lift pins,
   wherein the stage includes a first heating part provided therein and configured to heat the stage,
   wherein the plurality of lift pins are supported by a support member, and the support member is fixed to the lifter,
   wherein a plurality of second heating parts is configured to heat the plurality of lift pins, respectively, and
   wherein the plurality of second heating parts is provided around the plurality of lift pins in the support member, respectively.

2. The stage device of claim 1, wherein each of the plurality of lift pins further includes a temperature sensor provided therein.

3. The stage device of claim 2, wherein each of the plurality of second heating parts is formed of an electric resistance element.

4. The stage device of claim 3, wherein each of the plurality of second heating parts and the temperature sensor are formed of a common electric resistance element.

5. The stage device of claim 2, wherein each of the plurality of second heating parts and the temperature sensor are formed of a common electric resistance element.

6. The stage device of claim 1, wherein each of the plurality of second heating parts is formed of an electric resistance element.

7. A stage device comprising:
   a stage having a pin hole provided therein and a placement surface on which a substrate is placed; and
   at least one lift pin configured to move up and down through the pin hole; and
   a lifter configured to raise and lower the at least one lift pin,
   wherein the stage includes a first heating part provided therein and configured to heat the stage,
   wherein the at least one lift pin includes a second heating part provided therein or therearound and configured to heat the at least one lift pin,
   wherein the second heating part is formed of a conductor, and
   wherein the conductor is provided with a coil configured to induce an induced current.

8. A substrate processing apparatus, comprising:
   a processing container configured to process a substrate;
   a stage device; and
   a controller,
   wherein the stage device includes:
   a stage having a pin hole provided therein and a placement surface on which the substrate is placed; and
   a lift pin configured to move up and down in the pin hole while being inserted through the pin hole; and
   a lifter configured to raise and lower the lift pin,
   wherein the stage includes a first heating part provided therein and configured to heat the stage,
   wherein the lift pin includes a second heating part provided therein or therearound and configured to heat the lift pin,
   wherein the controller controls temperature adjustments performed by the first heating part and the second heating part,
   wherein the second heating part is formed of a conductor, and
   wherein the conductor is provided with a coil configured to induce an induced current.

* * * * *